(12) United States Patent
Na et al.

(10) Patent No.: US 7,571,533 B2
(45) Date of Patent: Aug. 11, 2009

(54) METHOD OF MANUFACTURING A MICRO FLUX GATE SENSOR

(75) Inventors: Kyoung-won Na, Seoul (KR); Jingli Yuan, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 567 days.

(21) Appl. No.: 11/408,047

(22) Filed: Apr. 21, 2006

(65) Prior Publication Data

US 2007/0115585 A1    May 24, 2007

(30) Foreign Application Priority Data

Nov. 18, 2005    (KR) .................. 10-2005-0110949

(51) Int. Cl.
  *G01R 3/00*    (2006.01)

(52) U.S. Cl. .................. 29/595; 29/602.1; 29/605; 29/606; 205/119; 205/122; 216/22; 216/39; 216/41; 216/48; 310/179; 310/208; 336/176; 336/200; 336/229

(58) Field of Classification Search ............... 29/592.1, 29/595, 602.1, 605, 606; 205/119, 122; 216/22, 216/39, 41, 48; 310/179, 208; 336/176, 336/200, 229

See application file for complete search history.

(56) References Cited

U.S. PATENT DOCUMENTS

| 6,411,086 | B1 * | 6/2002 | Choi et al. | 324/253 |
| 7,208,947 | B2 * | 4/2007 | Park et al. | 324/253 |
| 7,389,576 | B2 * | 6/2008 | Na et al. | 29/595 |
| 2005/0024050 | A1 * | 2/2005 | Na et al. | 324/253 |
| 2005/0172480 | A1 * | 8/2005 | Choi et al. | 29/607 |

\* cited by examiner

*Primary Examiner*—Paul D Kim
(74) *Attorney, Agent, or Firm*—Sughrue Mion, PLLC

(57) ABSTRACT

A method of manufacturing a micro flux gate sensor and a micro flux gate sensor manufactured according to the method are provided. The method includes operations of forming a lower coil portion of an excitation coil and a magnetic field detecting coil on a wafer, forming connection portions with a certain height at predetermined positions of the lower coil portion, forming a first insulation layer to cover the lower coil portion and the connection portions, forming a magnetic core on the first insulation layer, forming a second insulation layer to cover the magnetic core and forming an upper coil portion electrically connected to the connection portions to form the excitation coil and the magnetic field detecting coil, and forming a third insulation layer to cover the upper coil portion.

7 Claims, 8 Drawing Sheets

METHOD OF MANUFACTURING A MICRO FLUX GATE SENSOR

CROSS-REFERENCE TO RELATED APPLICATIONS

This application claims priority, under 35 U.S.C. § 119, from Korean Patent Application No. 10-2005-0110949 filed on Nov. 18, 2005, in the Korean Intellectual Property Office, the disclosure of which is incorporated herein by reference in its entirety.

BACKGROUND OF THE INVENTION

1. Field of the Invention

Apparatuses and methods consistent with the present invention relate to a micro flux gate sensor and method of manufacturing the same.

2. Description of the Related Art

A fluxgate sensor is a device that detects magnetic energy which is not perceivable by human sense organs. Such a magnetic detection sensor may be used in applications that require detection of a magnetic energy formed around a circumference. For example, these applications may include position identification of airplanes, vessels and vehicles, motion detection in a virtual reality space, geomagnetic compensation and dot noise compensation for a high definition television (HDTV), magneto-encephalograph and magneto-cardiograph measurement acquisition in a medical device, and the like.

Recently, since the fields of application have gradually spread, there has been a trend toward providing devices that are thinner, lighter and less expensive. Correspondingly, there has been a trend toward providing a fluxgate sensor that is thinner, lighter and less expensive.

A micro fluxgate sensor primarily includes a core made of soft magnetic material, an excitation coil wound around the core for inducing a magnetic field when a current is applied thereto, and a magnetic field detecting coil for detecting an effect of an external magnetic field on the magnetic field induced by the excitation coil. A basic detecting principle utilizes a nonlinear characteristic of the soft magnetic core, i.e., a saturation characteristic. If a proper alternating current (AC) is applied to the excitation coil to induce the magnetic field, a flux density in the core is periodically saturated. At that time, if the external magnetic field to be measured is applied, the flux density of the core varies. The magnetic filed detecting coil measures a variation of the flux to determine a dimension, either strength or direction, of the external magnetic field.

In order to manufacture a micro fluxgate sensor, a coil is generally wound around a large, bar-type core or a ring-type core of a soft magnetic ribbon. Accordingly, the core itself becomes relatively large thereby enlarging a volume of the core and increasing a manufacturing cost of the core. In addition, since the flux variation generated by the excitation coil and the detected magnetic field do not prevent a flux leakage due to the core, highly sensitive detection of the magnetic field is not readily achieved.

Therefore, various methods of manufacturing a flux gate sensor by using the micro electro-mechanical system (MEMS) technique have been studied and developed.

For example, a first seed layer is formed on a wafer and a metal material is plated according to a certain pattern on the first seed layer to form a lower coil. A first insulation layer is formed on the lower coil and a core layer of magnetic material is formed at a position corresponding to the lower coil, on the first insulation layer. Then, a second insulation layer is formed to cover the core layer, and the first and the second insulation layers are etched to form a viahole so as to expose the lower coil.

Then, a second seed layer is formed on the viahole and the second insulation layer and a metal material is plated according to a certain pattern on the second seed layer to form an upper coil. Since the viahole is filled with the metal material, and the upper coil and the lower coil are electrically connected. A third insulation layer is formed to cover the upper coil. According to this process, a flux gate sensor is manufactured.

However, according to the conventional method of manufacturing the flux gate sensor, it is impossible to measure whether the viahole is formed to open the lower coil because the size of the viahole is too small. Accordingly, the lower coil and the upper coil may not be electrically connected although the seed layer is formed on the viahole and the viahole is filled with the metal material.

If the viahole is formed too largely in view of the above disadvantage, the metal material filling neighboring viaholes comes into contact with each other to generate inferiority.

SUMMARY OF THE INVENTION

The present invention has been conceived to address the above-mentioned problems occurring in the prior art, and an aspect of the present invention is to provide a method of manufacturing a micro flux gate sensor that has a good electrical connection and can be easily manufactured. Another aspect of the present invention provides a micro flux gate sensor manufactured according to the above method.

In order to achieve the above aspects, there is provided a method of manufacturing a micro flux gate sensor comprising (a) forming at least one lower coil portion of at least one of an excitation coil and a magnetic field detecting coil on a wafer, (b) forming at least one connection portion with a certain height at a predetermined position on the lower coil portion, (c) forming a first insulation layer to cover the lower coil portion and the connection portion, (d) forming at least one magnetic core on the first insulation layer, (e) forming a second insulation layer to cover the magnetic core and forming at least one upper coil portion electrically connected to the connection portion to form the excitation coil and the magnetic field detecting coil, and (f) forming a third insulation layer to cover the upper coil portion.

The operation of (a) may comprise operations of cleaning the wafer and forming a first seed layer, forming a plurality of first photo-resist membrane patterns on an upper portion of the first seed layer, and electroplating portions between the first photo-resist membrane patterns with a metal material to form the lower coil portion.

The operation of (b) may comprise operations of forming a plurality of second photo-resist membrane patterns on the first photo-resist membrane patterns, electroplating portions between the second photo-resist membrane patterns with a metal material to form connection portion connected to the lower coil portion, and removing the first photo-resist membrane patterns and the second photo-resist membrane patterns and removing the first seed layer exposed according to the removing of the first and the second photo-resist membrane patterns.

The operation of (d) may include operations of planarizing the first insulation layer, depositing a magnetic material on the planarized first insulation layer, and patterning the deposited magnetic material to form the magnetic core.

The operation of (e) may include operations of forming a second insulation layer to cover the magnetic core, etching the first insulation layer and the second insulation layer deposited on the connection portions to expose the connection portions, depositing a second seed layer on the exposed connection portions and the second insulation layer, forming a plurality of third photo-resist membrane patterns on the second seed layer, electroplating portions between the third photo-resist membrane patterns with a metal material, and removing the third photo-resist membrane patterns and removing the second seed layer exposed according to the removing of the third photo-resist membrane patterns to form the upper coil portion.

The operation of (f) may comprise an operation of forming a third insulation layer to cover the exposed upper coil portion.

The lower coil portion, the connection portions and the upper coil portion may comprise copper.

There is also provided a micro flux gate sensor manufactured to the foregoing method. The micro flux gate sensor may comprise first and second magnetic cores, which are parallel to each other, and a plurality of coils, each coil comprising a first core coil wound around the first magnetic core and a second core coil wound around the second magnetic core. Here, each of the first and second core coils may comprise upper and lower portions; the upper and lower portions of the first core coil may be connected to each other; and the upper and lower portions of the second core coil may be connected to each other. Among the plurality of coils, a predetermined number of coils may serve as excitation coils and remaining coils may serve as magnetic field detecting coils, in which the predetermined numbers of coils may be connected to each other and the remaining coils connected to each other.

BRIEF DESCRIPTION OF THE DRAWINGS

The above and other aspects, features and advantages of the present invention will be more apparent from the following detailed description taken with reference to the accompanying drawings, in which.

DETAILED DESCRIPTION OF THE EXEMPLARY EMBODIMENTS

Figure 1:
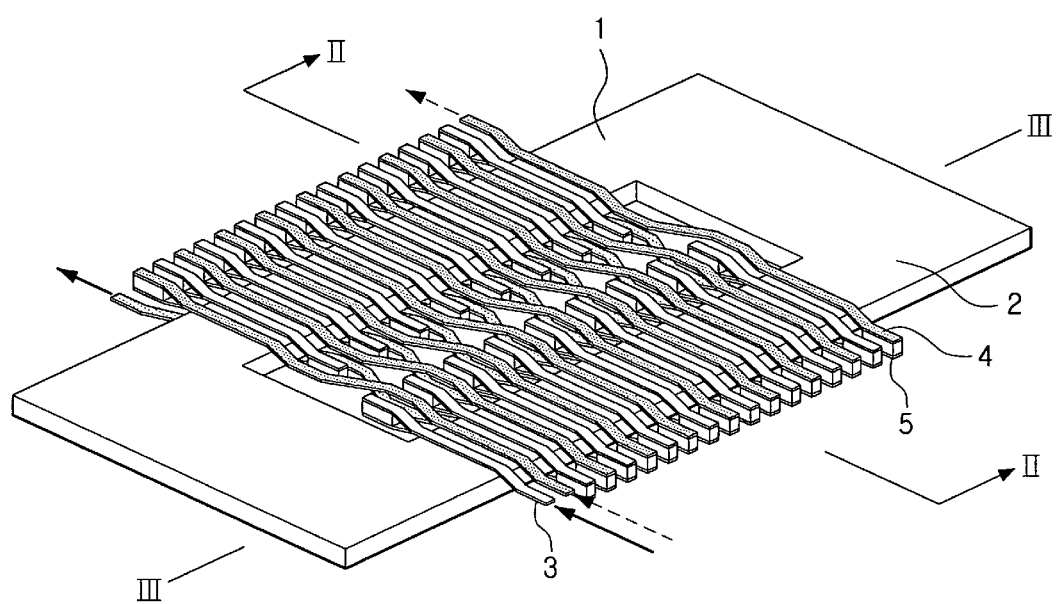
FIG. 1 is a view illustrating a micro flux gate sensor manufactured according to an embodiment of the present invention.

Exemplary embodiments of the present invention will be described in detail with reference to the annexed drawings. In the drawings, the same elements are denoted by the same reference numerals throughout the drawings. In the following description, detailed descriptions of known functions and configurations incorporated herein have been omitted for conciseness and clarity.

FIG. 1 illustrates a basic structure of a micro flux gate sensor manufactured according to an exemplary embodiment of the present invention. Referring to FIG. 1, the micro flux-gate sensor includes two bar-type magnetic cores 1 and 2, an excitation coil 3 wound around the magnetic cores 1 and 2, and a magnetic field detecting coil 4 wound around the excitation coil 3 and the two magnetic cores 1 and 2.

The respective coils 3 and 4 include a lower coil portion and an upper coil portion formed on a wafer, and the respective lower coil portions and the respective upper coil portions are joined by a connection portion 5 to form a coil. The coil portions, i.e., the excitation coil 3 and the magnetic field detecting coil 4 may be divided into an excitation coil and a detecting coil according to an intension of a manufacturer. Hereafter, the coil portion is collectively manufactured without the operation of manufacturing the magnetic field detecting coil, and connections between coils are varied to divide the coil portion into an excitation coil and a magnetic field detecting coil. For example, even-numbered coils may be used for excitation coils, and odd-numbered coils may be used for magnetic field detecting coil, or vice versa. To this end, during the connection of coil portions, coil portions to be used for the excitation coils are connected to each other and coil portions to be used for the magnetic field detecting coils are connected to each other, and the coil portions are connected through each pad to external terminals.

One of the two bar-type cores 1 and 2 is called a first core 1, and the other is called a second core 2. According to an exemplary embodiment of the present invention, the lower coil of the first core 1 is connected to the upper coil of the second core 2, and the lower coil of the second core 2 is connected to the upper coil of the first core 1. This process is repeated. Accordingly, the excitation coil may be provided in '8' form with respect to the two bar-type cores.

Hereafter, the method of manufacturing a micro flux gate sensor according to an exemplary embodiment of the present invention will be explained by each process with reference to accompanying drawings.

Figure 2A:
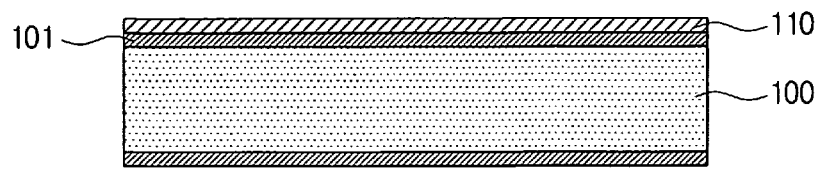
FIGS. 2A through 2K are cross-sectional views of a micro flux gate sensor taken on line II-II of FIG. 1 to explain a process of manufacturing a micro flux gate sensor according to an embodiment of the present invention.
Figure 3A:
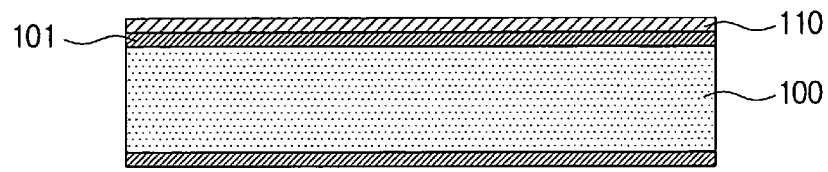
FIGS. 3A through 3M are cross-sectional views of a micro flux gate sensor taken on line III-III of FIG. 1 to explain a process of manufacturing a micro flux gate sensor according to an embodiment of the present invention.

As shown in FIGS. 2A and 3A, a general wafer 100 is cleaned and surface thereof is oxidized to form a certain thickness of an oxidation layer 101. On the oxidation layer 101, a first seed layer 110 is deposited. The first seed layer 110 is for electroplating lower coil portions 131. The electroplating operation will be explained later.

Figure 2B:
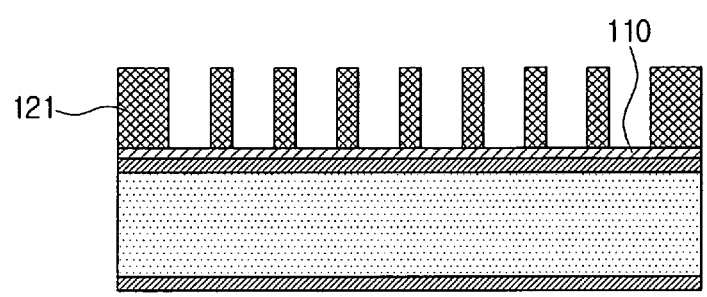
Figure 3B:
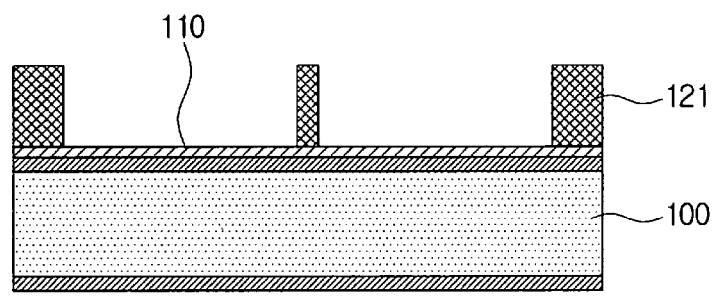

As shown in FIGS. 2B and 3B, first photo-resist membrane patterns 121 are formed on the first seed layer 110. The first photo-resist membrane patterns 121 serve as a mold to form the lower coil portions 131. The forming operation will be explained later.

Figure 2C:
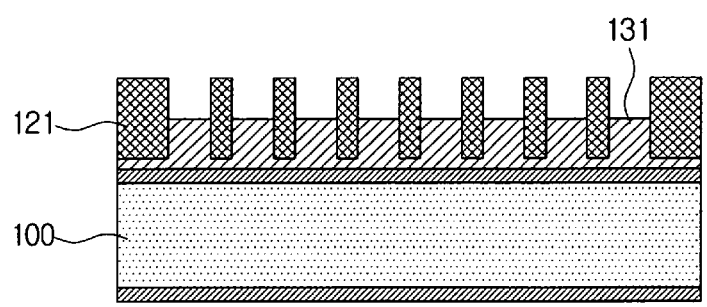
Figure 3C:
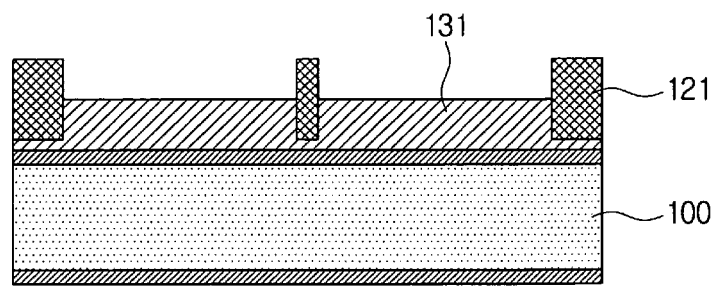

As shown in FIGS. 2C and 3C, portions between the first photo-resist membrane patterns 121 are electroplated with a metal material to form the lower coil portions 131. Preferably, but not necessarily, the metal material may be copper (Cu).

Figure 2D:
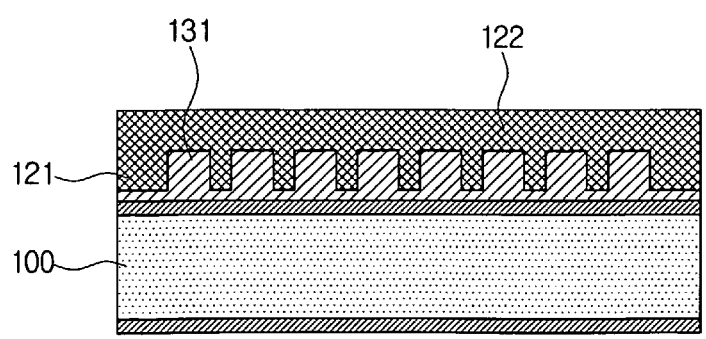
Figure 3D:
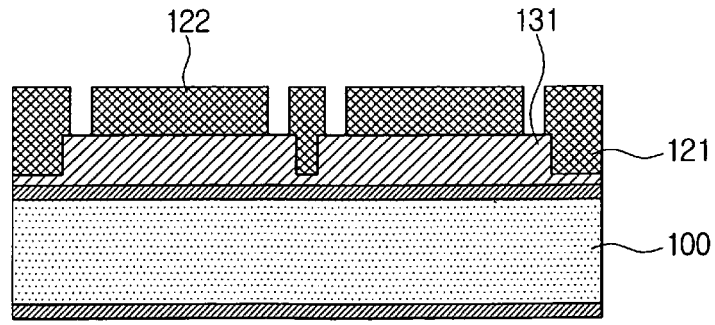

As shown in FIGS. 2D and 3D, while the first photo-resist membrane patterns 121 are left, and second photo-resist membrane patterns 122 are formed on the first photo-resist membrane patterns 121. The second photo-resist membrane patterns 122 serve as a mold to form connection portions 133, which will be explained later.

Figure 3E:
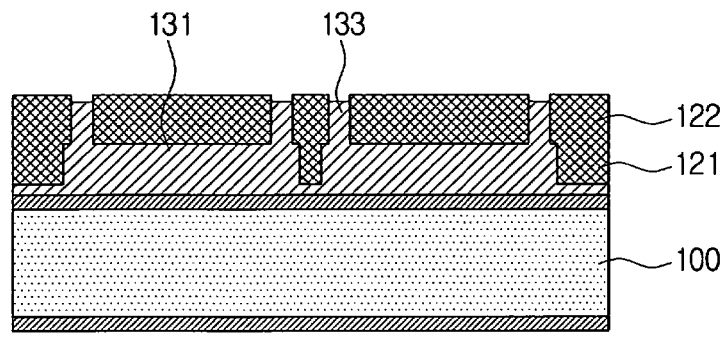

As shown in FIG. 3E, portions between the second photo-resist membrane patterns 122 are electroplated with metal materials to form the connection portions 133. In other words, if the second photo-resist membrane patterns 122 are formed as the first photo-resist membrane patterns 121 are not removed, it is easy to form the connection portions 133 on upper portions of the lower coil portions 131, which are formed in an earlier operation, by electroplating, and additional process is not necessary.

Figure 2E:
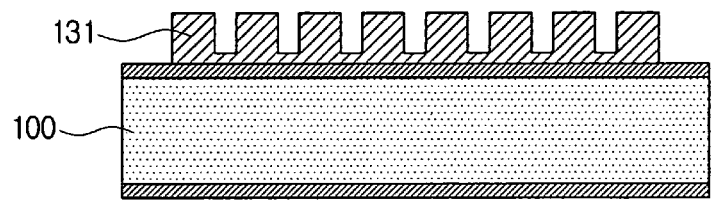
Figure 3F:
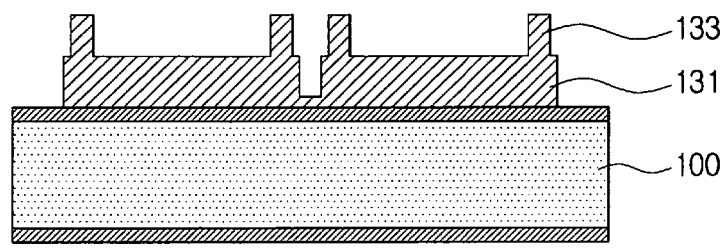

As shown in FIGS. 2E and 3F, the first photo-resist membrane patterns 121 and the second photo-resist membrane patterns 122 are together removed and the first seed layer 110 exposed according to the removals, is removed to form the lower coil portions 131 and the connection portions 133.

Figure 2F:
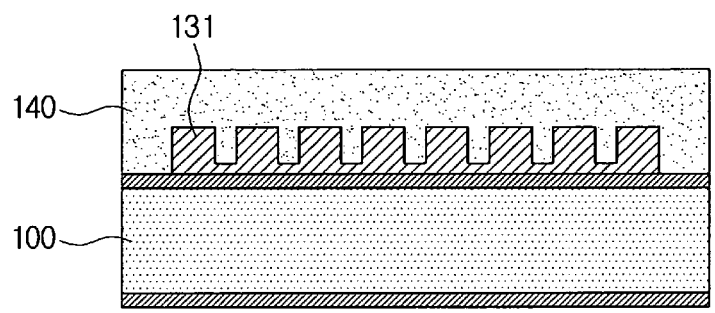
Figure 3G:
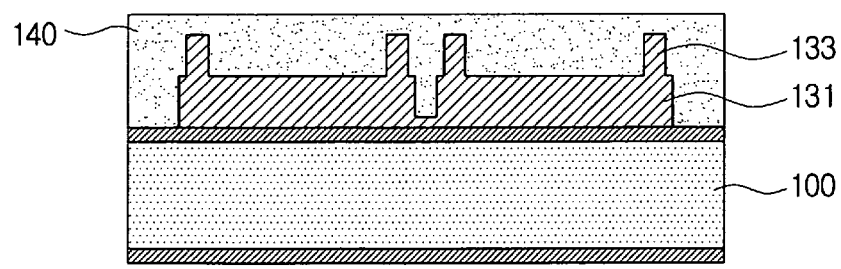

As shown in FIGS. 2F and 3G, a first insulation layer 140 is deposited to cover the lower coil portions 131 and the connection portions 133 and planarized. Here, the first insulation layer 140 separates the lower coil portions 131 from a magnetic core 150, which will be formed in a later operation.

Figure 2G:
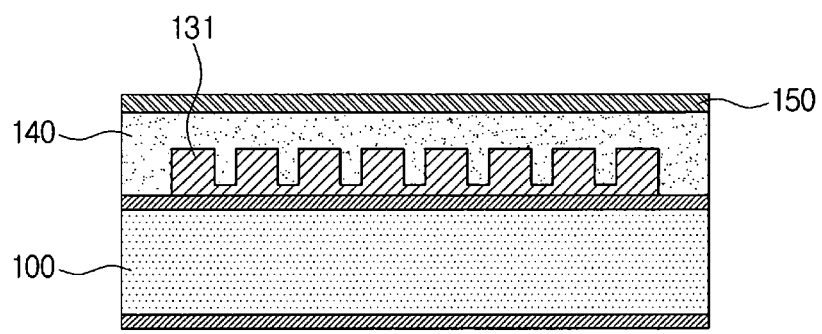
Figure 3H:
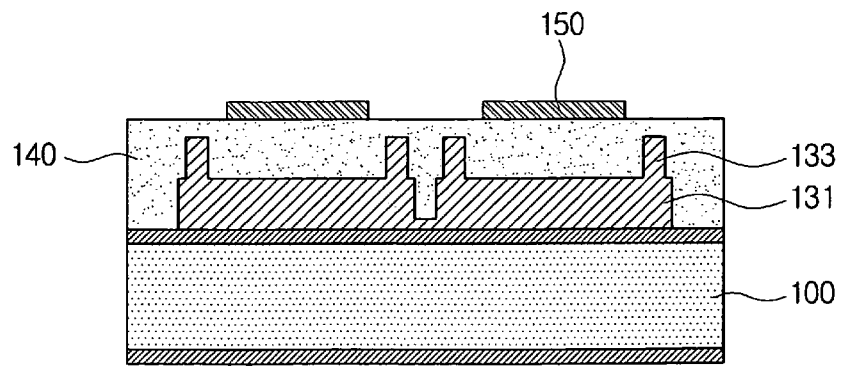

As shown in FIGS. 2G and 3H, upper portions of the first insulation layer 140, i.e., portions corresponding to the lower coil portions 131 are patterned with a magnetic material to form the magnetic core 150. To form the magnetic core 150, a magnetic core material may be deposited on the first insulation layer 140 and mask-patterned.

Figure 2H:
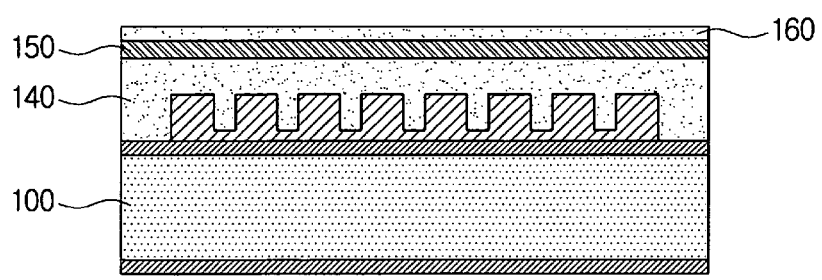
Figure 3I:
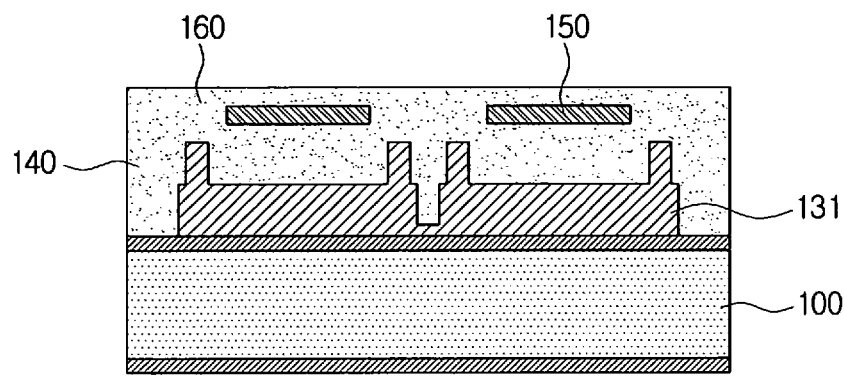

As shown in FIGS. 2H and 3I, a second insulation layer 160 is formed to cover the magnetic core 150. The second insulation layer 160 electrically isolates the magnetic core 150 from upper coil portions 135 which will be formed in a later operation.

Figure 3J:
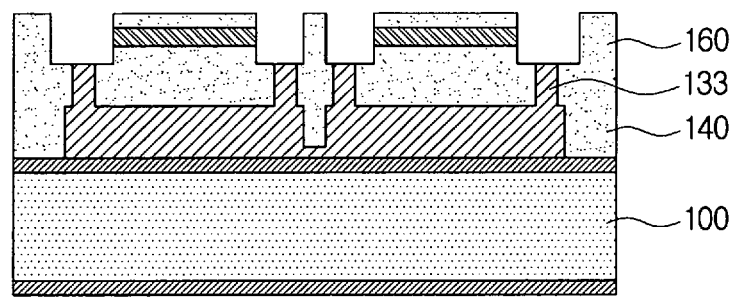

As shown in FIG. 3J, the first insulation layer 140 and the second insulation layer 160 formed on the upper portions of the connection portions 133, are removed according to etching process to expose the connection portions 133.

Figure 2I:
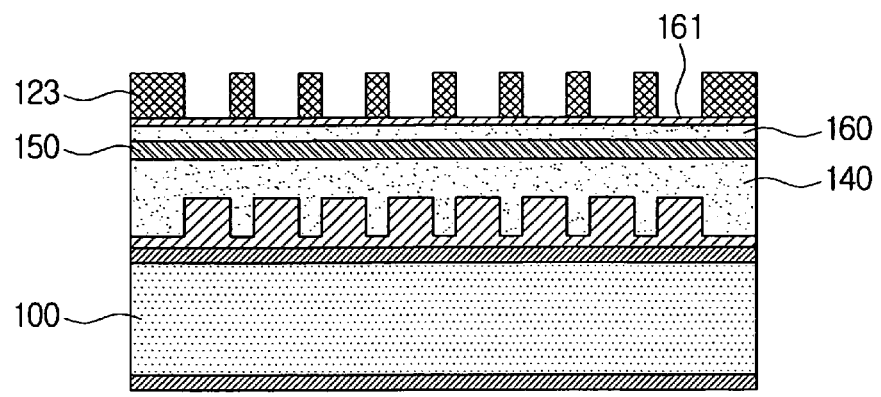
Figure 3K:
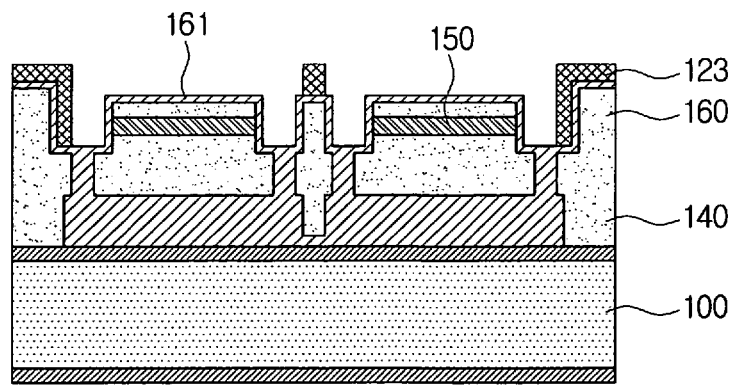

As shown in FIGS. 2I and 3K, the second seed layer 161 is deposited and third photo-resist membrane patterns 123 are formed thereon. The third photo-resist membrane patterns 123 serve as a mold to form the upper coil portions 135 connected to the connection portions 133.

Figure 2J:
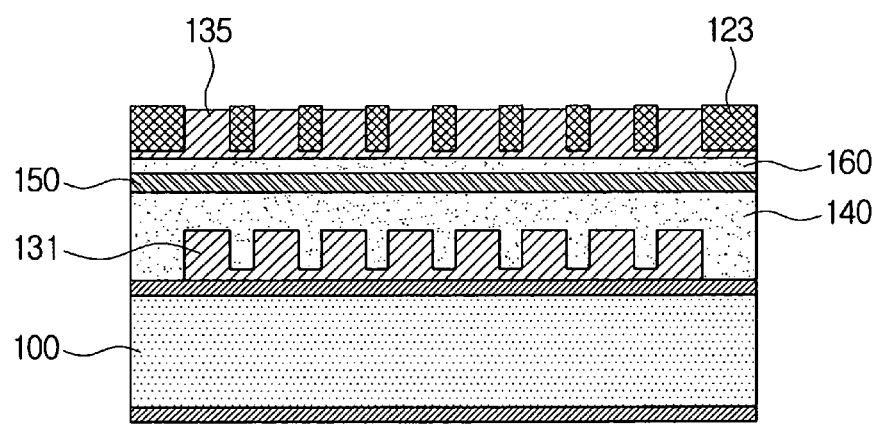
Figure 3L:
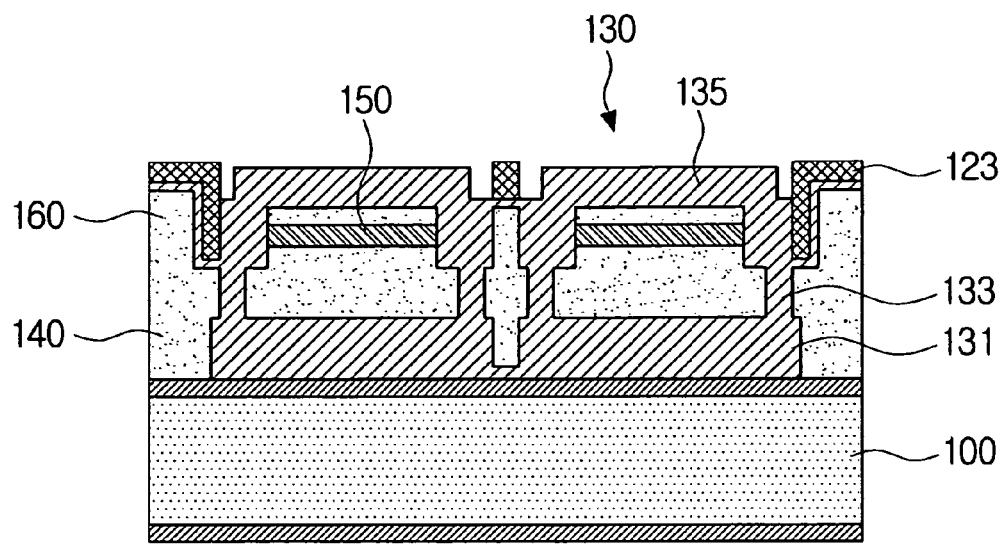

As shown in FIGS. 2J and 3L, portions between the third photo-resist membrane patterns 123 are electroplated with a metal material, preferably, but not necessarily, such as copper (Cu) to form the upper coil portions 135.

Figure 2K:
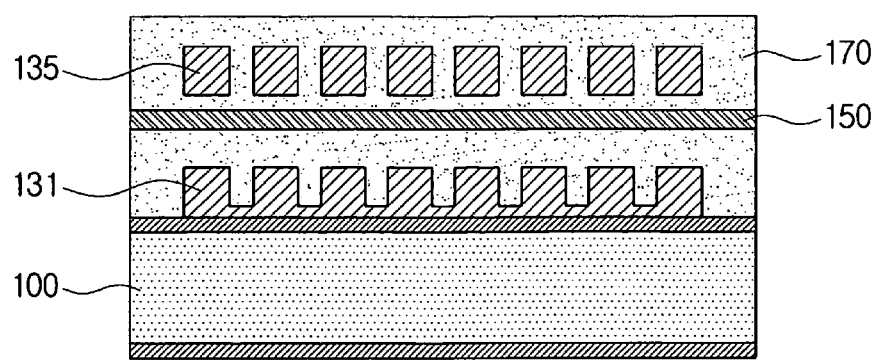
Figure 3M:
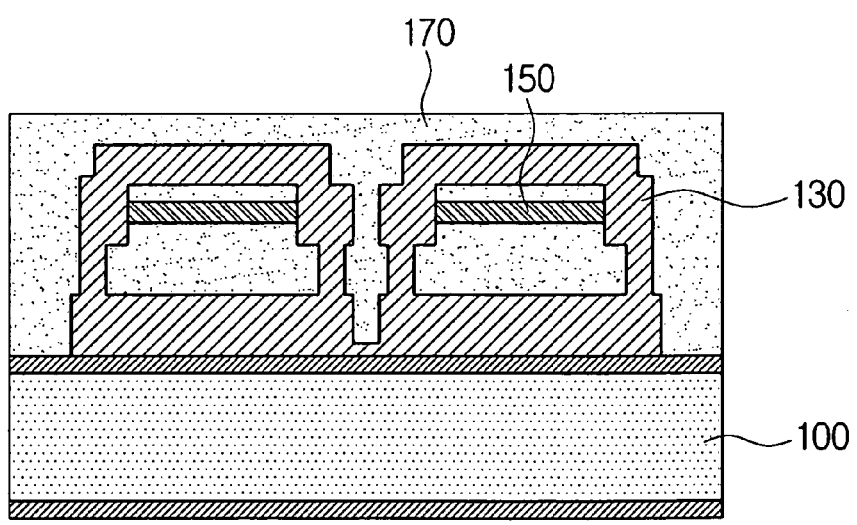

As shown in FIGS. 2K and 3M, as the third photo-resist membrane patterns 123 are removed and the exposed second seed layer 161 is etched away, the upper coil portions 135 are connected to the connection portions 133 to form a coil 130 wound based on the magnetic core 150.

A third insulation layer 170 is formed to cover the upper coil portions 135. The third insulation layer 170 is for preventing and separating the upper coil portions 135 from the outside.

The third insulation layer 170 is formed on the upper portion of the coil 130 so that the manufacturing of the micro flux gate sensor is completed, in which the coil 130 is formed to wind the magnetic core 150.

According to the exemplary method of manufacturing the micro flux gate sensor of the present invention as described above, the photo-resist membrane patterns are formed in two layers to form the connection portions connecting the lower coil portions and the upper coil portions, which form a coil. Accordingly, a conventional process, in which separate viaholes are formed on the insulation layer by etching, is not necessary. Therefore, the manufacturing process becomes simpler, and the connection between the connection portions and the lower coil portions becomes better.

Additionally, because the connection portions are formed according to the photo-resist membrane patterns, the electrical characteristic is improved and inferiority rate can be reduced.

In addition, the sensor can be manufactured in a compact size, and the completion of the plating process is improved so that the electrical characteristic can be improved and the coil resistance becomes stable. Therefore, the inferiority rate can be reduced and the characteristic of sensor can be enhanced.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of manufacturing a micro flux gate sensor, comprising:

(a) forming at least one lower coil portion of at least one of an excitation coil and a magnetic field detecting coil on a wafer;

(b) forming at least one connection portion with a certain height at a predetermined position on the lower coil portion;

(c) forming a first insulation layer to cover the lower coil portion and the connection portion;

(d) forming at least one magnetic core on the first insulation layer;

(e) forming a second insulation layer to cover the magnetic core and forming at least one upper coil portion electrically connected to the connection portion to form the excitation coil and the magnetic field detecting coil; and (f) forming a third insulation layer to cover the upper coil portion.

2. The method according to claim 1, wherein the operation of (a) comprises:

cleaning the wafer and forming a first seed layer;

forming a plurality of first photo-resist membrane patterns on an upper portion of the first seed layer; and electroplating portions between the first photo-resist membrane patterns with a metal material to form the lower coil portion.

3. The method according to claim 2, wherein the operation of (b) comprises:

forming a plurality of second photo-resist membrane patterns on the first photo-resist membrane patterns;

electroplating portions between the second photo-resist membrane patterns with a metal material to form the connection portion connected to the lower coil portion; and removing the first photo-resist membrane patterns and the second photo-resist membrane patterns and removing the first seed layer exposed according to the removing of the first and the second photo-resist membrane patterns.

4. The method according to claim 1, wherein the operation of (d) comprises:

planarizing the first insulation layer;

depositing a magnetic material on the planarized first insulation layer; and patterning the deposited magnetic material to form the magnetic core.

5. The method according to claim 4, wherein the operation of (e) comprises:

forming a second insulation layer to cover the magnetic core;

etching the first insulation layer and the second insulation layer deposited on the connection portion to expose the connection portion;

depositing a second seed layer on the exposed connection portion and the second insulation layer;

forming a plurality of third photo-resist membrane patterns on the second seed layer;

electroplating portions between the third photo-resist membrane patterns with a metal material; and removing the third photo-resist membrane patterns and removing the second seed layer exposed according to the removing of the third photo-resist membrane patterns to form the upper coil portion.

6. The method according to claim 5, wherein the operation of (f) comprises forming a third insulation layer to cover the exposed upper coil portion.

7. The method according to claim 1, wherein at least one of the lower coil portion, the connection portion and the upper coil portion comprises copper.

* * * * *